United States Patent
Nien et al.

(10) Patent No.: US 9,134,858 B2
(45) Date of Patent: Sep. 15, 2015

(54) TOUCH PANEL FOR ELECTROSTATIC DISCHARGE PROTECTION AND ELECTRONIC DEVICE USING THE SAME

(75) Inventors: Kai-Chi Nien, Chu-Nan (TW); Kazuyuki Hashimoto, Chu-Nan (TW); Chia-Lin Liu, Chu-Nan (TW)

(73) Assignee: INNOLUX CORPORATION, Miao-Li County (TW)

( * ) Notice: Subject to any disclaimer, the term of this patent is extended or adjusted under 35 U.S.C. 154(b) by 135 days.

(21) Appl. No.: 13/288,518

(22) Filed: Nov. 3, 2011

(65) Prior Publication Data

US 2013/0113711 A1    May 9, 2013

(51) Int. Cl.
G06F 3/041 (2006.01)
G06F 3/044 (2006.01)
H05K 9/00 (2006.01)

(52) U.S. Cl.
CPC .............. *G06F 3/044* (2013.01); *H05K 9/0067* (2013.01)

(58) Field of Classification Search
CPC .................................................. G06F 3/03547
USPC .......................................................... 345/173
See application file for complete search history.

(56) References Cited

U.S. PATENT DOCUMENTS

| | | | | |
|---|---|---|---|---|
| 5,872,561 A * | 2/1999 | Figie et al. | ..................... | 345/168 |
| 7,196,695 B2 * | 3/2007 | Lin | ................. | 345/173 |
| 7,852,323 B2 * | 12/2010 | Parkinson et al. | ............ | 345/173 |
| 8,395,395 B2 * | 3/2013 | Bruwer et al. | ................ | 324/686 |
| 2002/0000979 A1 * | 1/2002 | Furuhashi et al. | ............ | 345/173 |
| 2002/0101409 A1 * | 8/2002 | Yokoyama et al. | ........... | 345/173 |
| 2002/0163509 A1 * | 11/2002 | Roberts | ......................... | 345/173 |
| 2003/0030054 A1 * | 2/2003 | Hector et al. | .................... | 257/72 |
| 2004/0263483 A1 * | 12/2004 | Aufderheide | ................. | 345/173 |
| 2006/0017701 A1 * | 1/2006 | Marten et al. | ................. | 345/173 |
| 2006/0055679 A1 * | 3/2006 | Grinshpoon et al. | ......... | 345/173 |
| 2007/0222766 A1 * | 9/2007 | Bolender | ...................... | 345/173 |
| 2010/0013791 A1 * | 1/2010 | Haga et al. | .................... | 345/174 |
| 2010/0026636 A1 * | 2/2010 | Jang et al. | ..................... | 345/173 |
| 2010/0045620 A1 * | 2/2010 | Long et al. | .................... | 345/173 |
| 2010/0097334 A1 * | 4/2010 | Choi et al. | ..................... | 345/173 |
| 2010/0315353 A1 * | 12/2010 | Huang et al. | .................. | 345/173 |
| 2011/0025612 A1 * | 2/2011 | Shiau | ............................ | 345/173 |

(Continued)

FOREIGN PATENT DOCUMENTS

CN         1539093 B        8/2010
CN       102096515 A        6/2011

(Continued)

OTHER PUBLICATIONS

Taiwanese Office Action dated on Sep. 24, 2014.

*Primary Examiner* — Roy Rabindranath
(74) *Attorney, Agent, or Firm* — Rabin & Berdo, P.C.

(57) ABSTRACT

A touch panel and an electronic device are provided. The touch panel includes a sensing electrode array, a touch controller, and an electrostatic discharge (ESD) protection circuit. The sensing electrode array is arranged in two dimensional array of n rows and m columns for generating a sensing signal in response to a touch on the touch panel. The touch controller is operationally connected to the sensing electrode array for receiving the sensing signal and identifying the touch on the touch screen. The ESD protection circuit includes ESD protection units each being electrically connected to a corresponding row or column of the sensing electrode array and the touch controller for electrostatic discharge protection.

10 Claims, 7 Drawing Sheets

(56) References Cited

U.S. PATENT DOCUMENTS

2011/0080358 A1* 4/2011 Park et al. .................... 345/173
2011/0102360 A1* 5/2011 Chen et al. ................... 345/173

FOREIGN PATENT DOCUMENTS

| CN | 102193695 A | 9/2011 |
| TW | 201229846 A | 7/2012 |

* cited by examiner

TOUCH PANEL FOR ELECTROSTATIC DISCHARGE PROTECTION AND ELECTRONIC DEVICE USING THE SAME

BACKGROUND OF THE INVENTION

1. Field of the Invention

The invention relates in general to a touch panel and an electronic device, and more particularly to a touch panel and an electronic device for electrostatic discharge (ESD) protection.

2. Description of the Related Art

A touch screen is an electronic visual display that can detect the presence and location of a touch within the touch-sensitive area or the display area. The term of touch generally refers to touching the display of the device with a finger, or hand. Touch screens can also sense other passive objects, such as a stylus. Touch screens serve as a user interface for a number of electronic applications, such as handheld devices, or tablet computers.

The touch screen has two main attributes. First, it enables one to interact directly with what is displayed. Second, it lets one do so without requiring any intermediate device that would need to be held in the hand, such as a mouse or a physical keyboard. Such displays can be attached to computers, or to networks as terminals. They also play a prominent role in the design of digital appliances such as the personal digital assistant (PDA), satellite navigation devices, mobile phones, and video games. Touch screens are becoming increasingly popular because of their ease and versatility of operation.

There is a capacitive touch screen which includes an insulator such as glass coated with a transparent conductor such as a sensing electrode made of indium tin oxide (ITO), and a touch sensor integrated circuit (IC) operationally connected with the sensing electrode. As the human body is also an electrical conductor, touching the surface of the screen results in a change of the screen's electric field, as well as a change of capacitance on the sensing electrode. Such capacitance variance can be converted into a sensing signal. Then, the touch sensor IC can receive the sensing signal and locate where the touch is.

In view of this, the sensing electrode can behave as a touch sensor for detecting variance of electric field. However, the behavior of the sensing electrode can also be regarded as an antenna for the touch sensor IC, which could damage the sensing electrode and/or the touch sensor IC if electrostatic charge accumulates on the sensing electrode and a sudden and momentary electric current discharges or flows towards the touch sensor IC. This situation becomes worse in the case of an in-cell touch screen since the sensing electrode is inside the cell gap of the screen, and usually is floated or isolated from ground.

SUMMARY OF THE INVENTION

The invention is directed to a touch panel and an electronic device, where an electrostatic discharge (ESD) protection circuit can be used to protect the touch screen from electrostatic discharge damage.

According to an aspect of the present invention, a touch panel is provided. The touch panel includes a sensing electrode array, a touch controller, and an electrostatic discharge (ESD) protection circuit. The sensing electrode array arranged in two dimensional arrays of n rows and m columns for generating a sensing signal in response to a touch on the touch panel. The touch controller is operationally connected to the sensing electrode array for receiving the sensing signal and identifying the touch on the touch screen. The ESD protection circuit includes ESD protection units each being electrically connected to a corresponding row or column of the sensing electrode array and the touch controller for electrostatic discharge protection.

According to another aspect of the present invention, an electronic device is provided. The electronic device includes a touch panel, and a processor. The touch panel includes a sensing electrode array, a touch controller, and an electrostatic discharge (ESD) protection circuit. The sensing electrode array arranged in two dimensional arrays of n rows and m columns for generating a sensing signal in response to a touch on the touch panel. The touch controller is operationally connected to the sensing electrode array for receiving the sensing signal and identifying the touch on the touch screen. The ESD protection circuit includes ESD protection units each being electrically connected to a corresponding row or column of the sensing electrode array and the touch controller for electrostatic discharge protection. The processor is operationally connected with the touch panel for controlling its operations.

The above and other aspects of the invention will become better understood with regard to the following detailed description of the preferred but non-limiting embodiment(s). The following description is made with reference to the accompanying drawings.

DETAILED DESCRIPTION OF THE INVENTION

A number of exemplary embodiments of a touch panel and an electronic device are provided as follows. In an embodiment, the touch panel has an electrostatic discharge (ESD) protection circuit which is used to protect sensing electrode array and a touch controller, so that the touch panel or the electronic device can have enhanced immunity to electrostatic discharge damage. Further description is provided as follows with reference to accompanying drawings.

Figure 1:
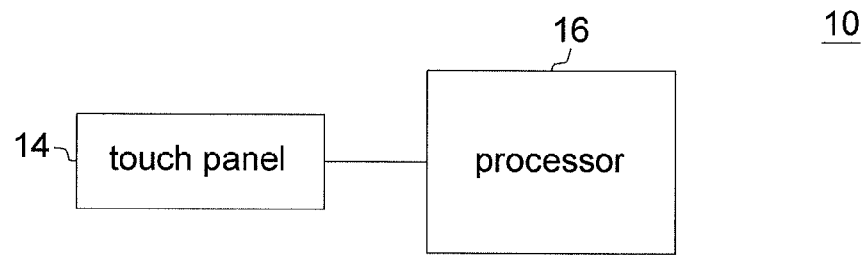
FIG. 1 is a block diagram showing an electronic device according to an embodiment of the invention.

FIG. 1 is a block diagram showing an electronic device according to an embodiment of the invention. The electronic device 10 may be a portable device such as a PDA, digital camera, notebook computer, tablet computer, cellular phone, a display monitor device, or other similar device. The electronic device 10 includes a touch panel 14 and a processor 16. The processor 16 is operationally connected with the touch panel 14 for controlling their operations.

Figure 2:
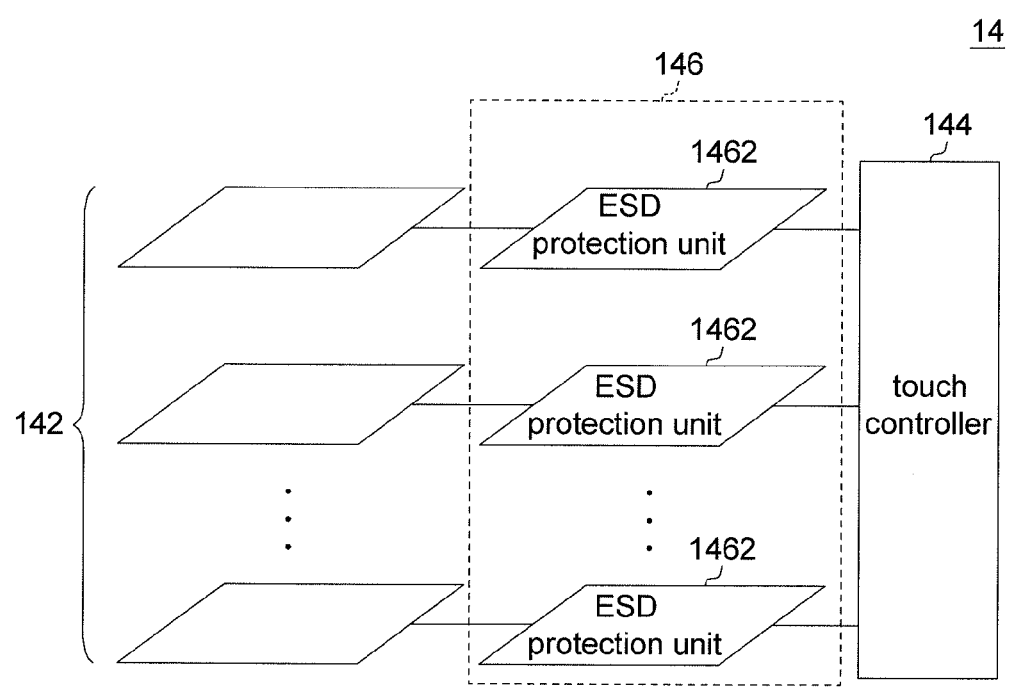
FIG. 2 is a schematic diagram showing the touch panel of the electronic device in FIG. 1.

FIG. 2 is a schematic diagram showing the touch panel of the electronic device in FIG. 1. The touch panel 14 includes sensing electrode array 142, a touch controller 144, and an electrostatic discharge (ESD) protection circuit 146. In some embodiments, the sensing electrode array 142 is disposed within an active area A1. Examples are provided with reference to FIG. 3 for further illustration.

Figure 3:
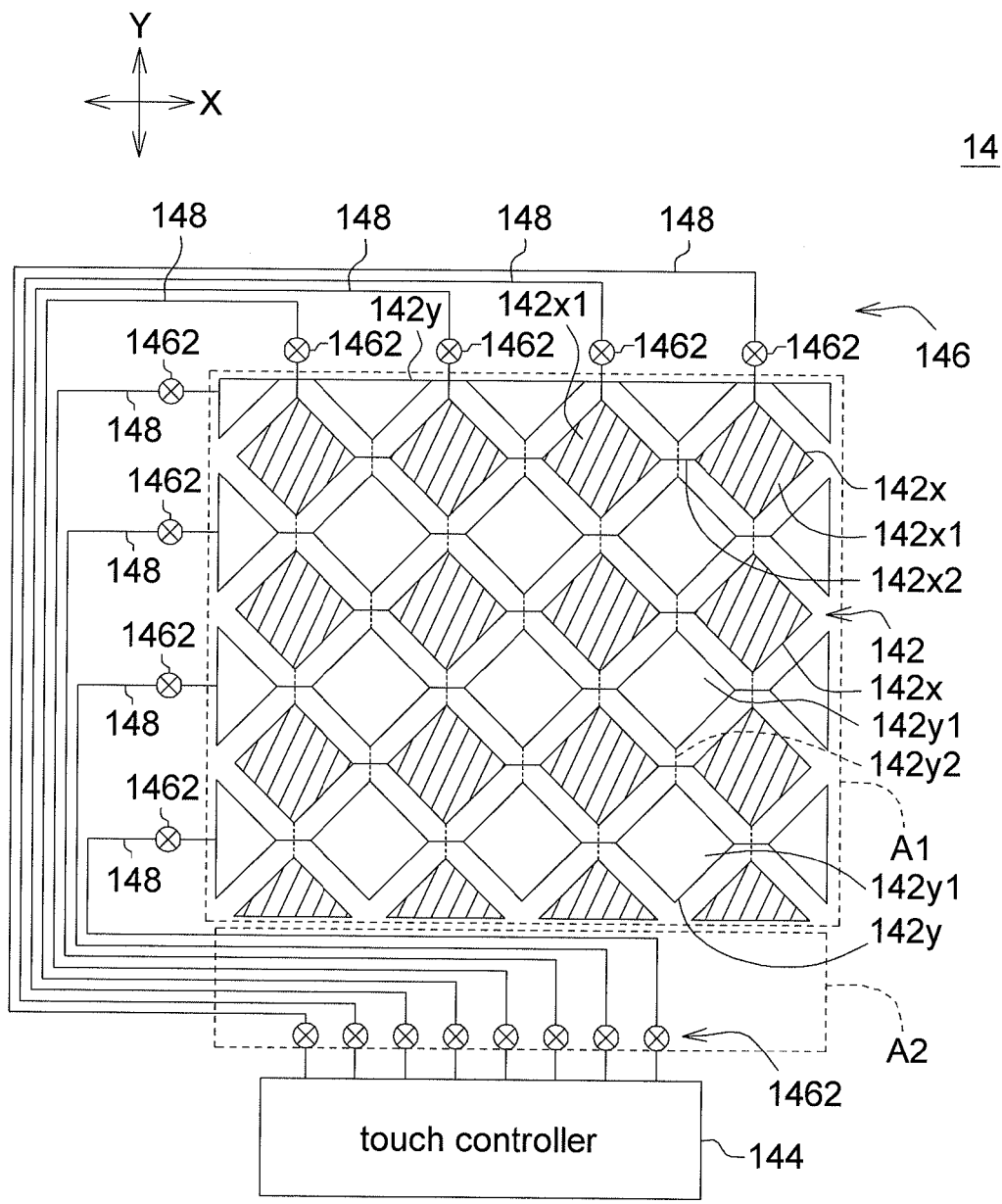
FIG. 3 is schematic diagram showing an example of the touch panel of FIG. 2.

FIG. 3 is schematic diagram showing an example of the touch panel of FIG. 2. The sensing electrode array 142 arranged in two dimensional array of n rows 142x and m columns 142y for generate a sensing signal in response to a touch on the touch panel 14. The touch controller 144 is connected to the sensing electrode array 142 for receiving the sensing signal and identifying the touch on the touch screen 14. The ESD protection circuit 146 includes at least n+m ESD protection units 1462. Each ESD protection unit 1462 is disposed at a non-active area A2. Each ESD protection unit 1462 is electrically connected to a corresponding row 142x or column 142y of the sensing electrode array 142 and the touch controller 144 for electrostatic discharge protection.

In this way, when abnormally-high electrostatic charge is accumulated on the sensing electrode array 142, a corresponding ESD protection unit 1462 can be activated to direct the discharged current into ground. Therefore, the sensing electrode array 142 and the touch controller 144 can be protected from electrostatic discharge damage, thus providing the touch panel 14 with enhanced immunity to electrostatic discharge damage.

The rows 142x are arranged on the touch panel 14 along X axial direction, and the columns 142y are arranged on the touch panel 14 along Y axial direction. Each row 142x comprises a number of row electrode units 142x1 and a number of row conductive wires 142x2, and the adjacent two row electrode units 142x1 are electrically connected by the corresponding row conductive wire 142x2. Each column 142y comprises a number of column electrode units 142y1 and a number of column conductive wires 142y2, and the adjacent two column electrode units 142y1 are electrically connected by the corresponding column conductive wire 142y2. Each row conductive wire 142x2 is separated from the corresponding column conductive wire 142y2 by an insulation layer (not illustrated) for avoiding the electrical connection of the rows 142x and the column 142y. The row electrode units 142x1 and the column electrode units 142y1 may be made from a transparent conductor such as an ITO. The row conductive wires 142x2 and the column conductive wires 142y2 may be made from a metal or ITO.

In this example, the touch panel 14 includes 8 signal lines 148. Each signal line 148 is used to electrically connect a corresponding row 142x or column 142y of sensing electrode array 142 to the touch controller 144, so as to deliver the sensing signal.

In this example, the touch panel 14 includes 8 ESD protection units 1462 disposed at a non-active area A2. In other words, each ESD protection unit 1462 can be disposed at a place near or adjacent to the edge or border outside the active area A1. As shown in FIG. 3, each ESD protection unit 1462 can be for example disposed at a place adjacent to where a signal line 148 is connected with a row or column of sensing electrode array 142. Moreover, the touch panel 14 can further include another 8 ESD protection units 1462 disposed within the non-active area A2. The non-active area A2 is for example an outer lead bond (OLB) area where a signal line 148 is connected with the touch controller 144.

In this way, when abnormally-high electrostatic charge is accumulated on the sensing electrode array 142, a corresponding ESD protection unit 1462 can be activated to direct the discharged current into ground. Therefore, the sensing electrode array 142 and the touch controller 144 can be protected from electrostatic discharge damage, thus providing the touch panel 14 with enhanced immunity to electrostatic discharge damage.

Refer to FIG. 2. In some embodiments, the ESD protection circuit 146 is rail-based where ESD current is directed to a power rail and then shunted to ground. Examples are provided with reference to FIGS. 4A to 4F as follows.

Figure 4A:
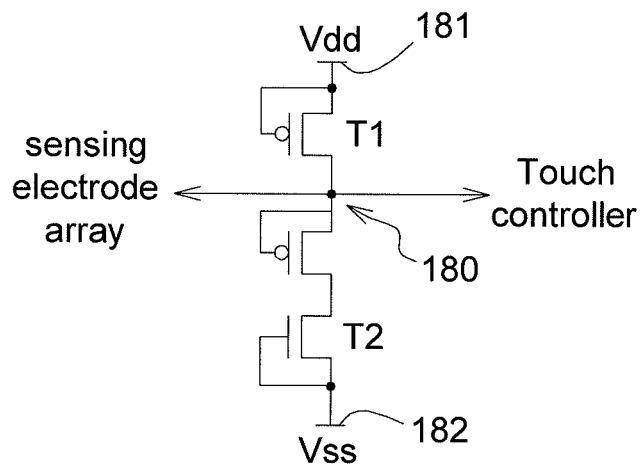
FIGS. 4A to 4F are circuit diagrams each showing an example of an ESD protection unit of FIG. 2.

FIG. 4A is a circuit diagram showing an example of an ESD protection unit of FIG. 2. In this example, there is provided an ESD protection unit 1462A. The ESD protection unit 1462A includes two diode-connected transistors T1 and T2. The transistor T1 is connected between a power rail 181 for receiving a power signal Vdd and a node 180 for detecting a level of the sensing signal. The transistor T2 is connected between a power rail 182 for receiving a power signal Vss and the node 180. The transistor T1 is for example a P-type thin film transistor, while the transistor T2 is for example an N-type thin film transistor.

Figure 4B:
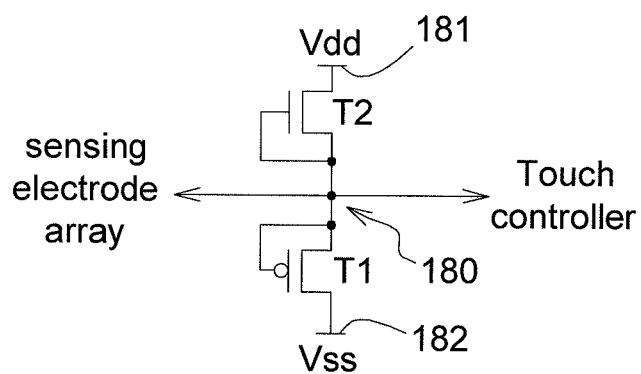

FIG. 4B is circuit diagram showing another example of an ESD protection unit of FIG. 2. In this example, there is provided an ESD protection unit 1462B. The ESD protection unit 1462B differs with the ESD protection unit 1462A in that the ESD protection unit 1462B has the P-type transistor T1 connected between the power rail 182 and the node 180, while the N-type transistor T2 connected between the power rail 181 and the node 180.

Figure 4C:
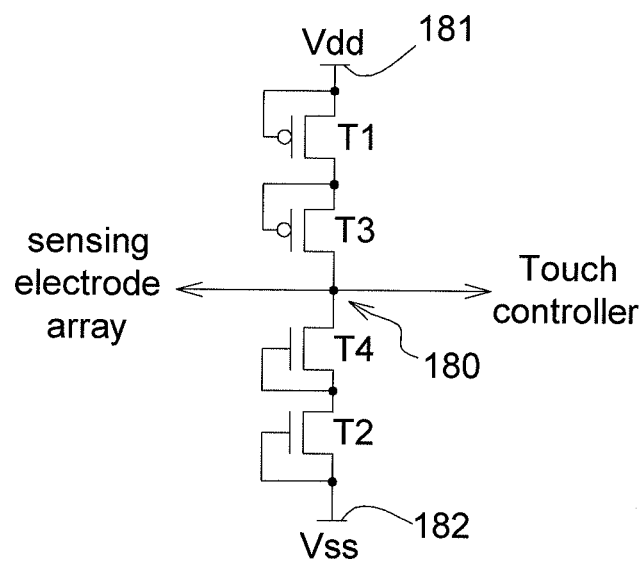

FIG. 4C is circuit diagram showing another example of an ESD protection unit of FIG. 2. In this example, there is provided an ESD protection unit 1462C. The ESD protection unit 1462C includes four diode-connected transistors T1 to T4. The transistors T1 and T3 are connected in series between the power rail 181 and the node 180. The transistors T2 and T4 are connected in series between the power rail 182 and the node 180. The transistors T2 and T4 are for example N-type thin film transistors. The transistors T1 and T3 are for example P-type thin film transistors.

Figure 4D:
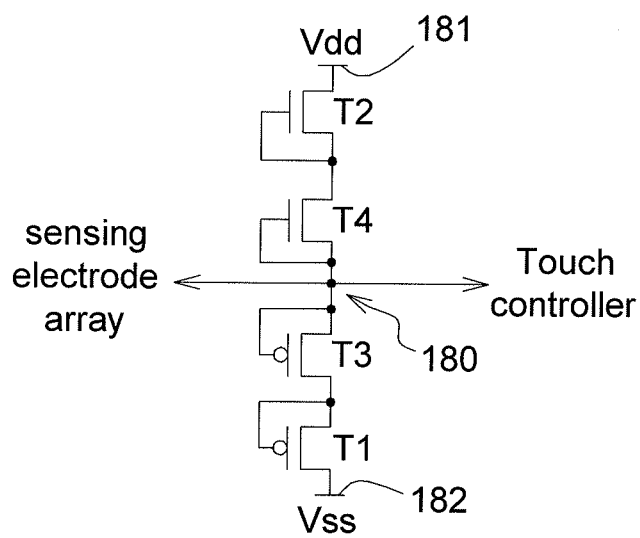

FIG. 4D is circuit diagram showing another example of an ESD protection unit of FIG. 2. In this example, there is provided an ESD protection unit 1462D. The ESD protection unit 1462D differs with the ESD protection unit 1462C in that the ESD protection unit 1462D has the P-type transistors T1 and T3 connected in series between the power rail 182 and the node 180, and N-type the transistors T2 and T4 connected in series between the power rail 181 and the node 180.

Figure 4E:
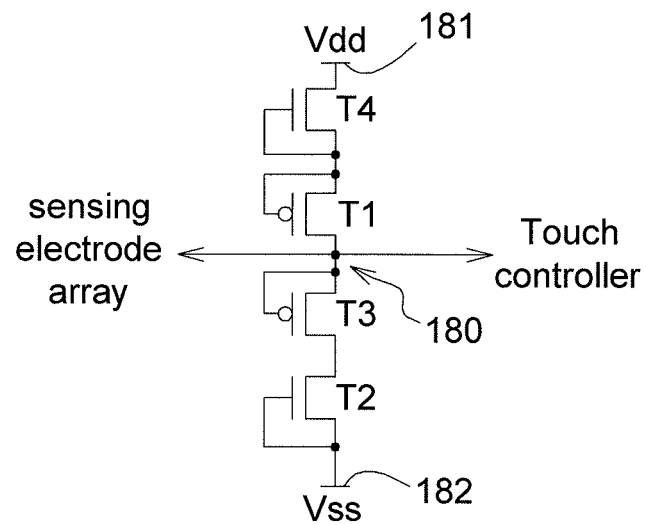

FIG. 4E is circuit diagram showing another example of an ESD protection unit of FIG. 2. In this example, there is provided an ESD protection unit 1462E. The ESD protection unit 1462E includes four diode-connected transistors T1 to T4. The N-type transistor T1 and P-type transistor T4 are connected in series between the power rail 181 and the node 180. The N-type transistor T2 and P-type transistor T3 are connected in series between the power rail 182 and the node 180. The P-type transistors T1 and T3 are connected in series between the N-type transistors T2 and T4.

Figure 4F:
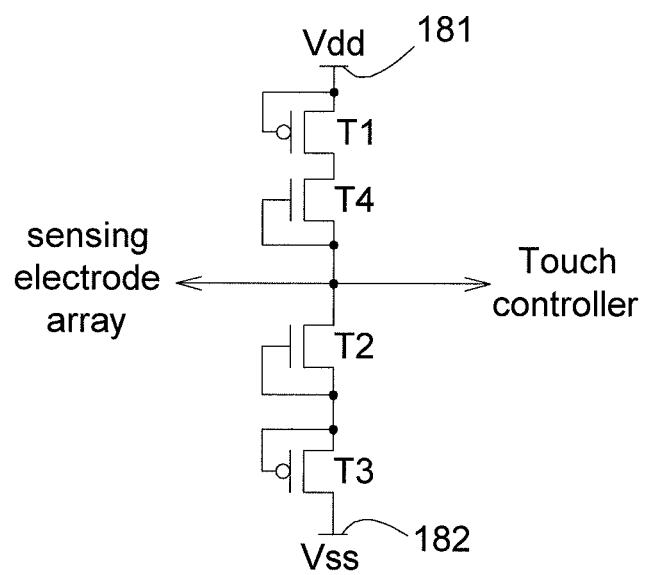

FIG. 4F is circuit diagram showing another example of an ESD protection unit. In this example, there is provided an ESD protection unit 1462F of FIG. 2. The ESD protection unit 1462F differs with the ESD protection unit 1462E in that the ESD protection unit 1462F have the N-type transistors T2 and T4 connected in series between the P-type transistors T1 and T3.

In above examples, it is exemplified that each ESD protection unit is implemented by diode-connected transistors, but this invention is not limited thereto. In other examples, an ESD protection unit can be implemented by a implemented by a trigger circuit, a buffer circuit, and/or a clamping circuit. In practical examples, an ESD protection unit can include elements such as diodes, capacitors, resistors, and/or active devices such as thyristors and transistors.

Figure 5:
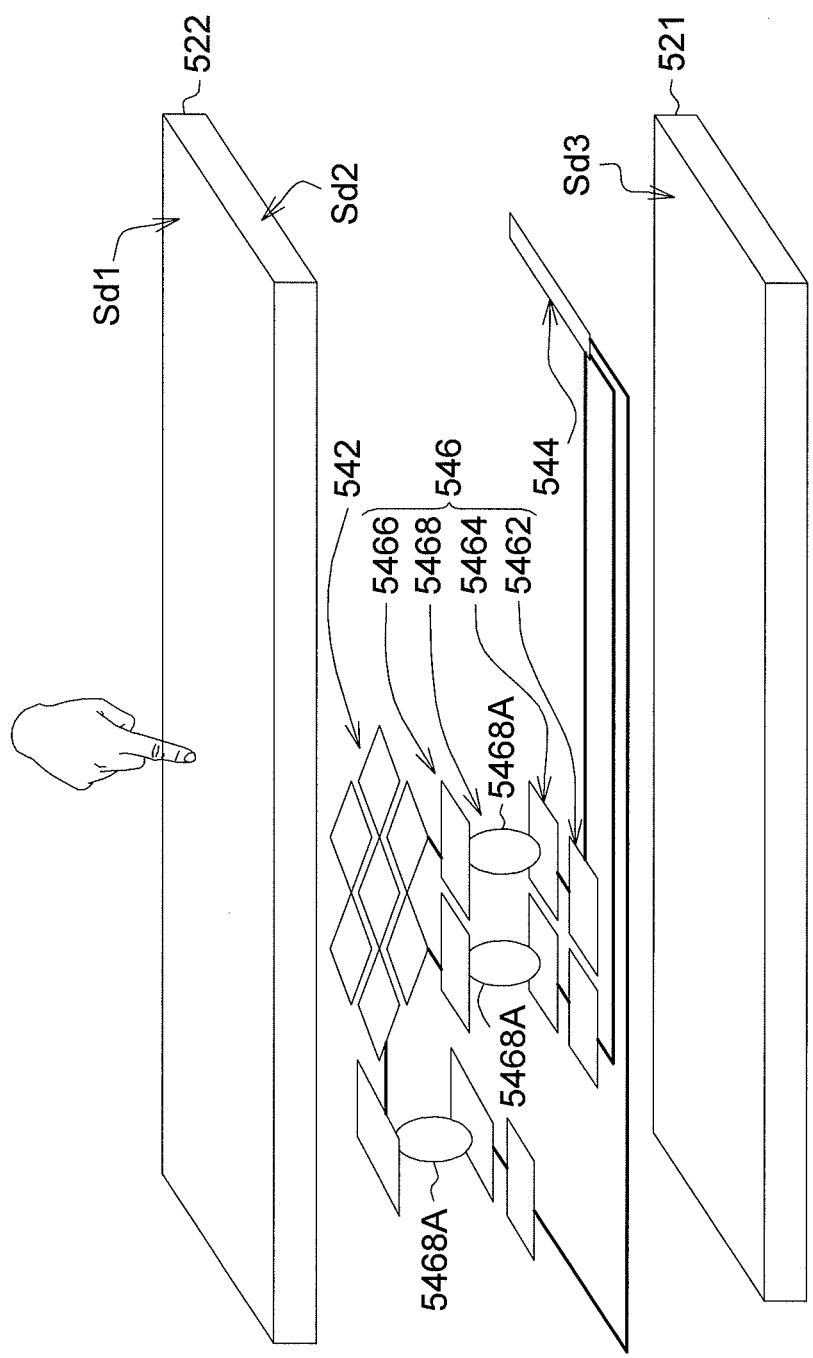
FIG. 5 is an exploded diagram showing an in-cell touch panel according to an embodiment of the invention.

FIG. 5 is an exploded diagram showing an in-cell touch panel according to an embodiment of the invention. In FIG. 5, an in-cell touch panel 50 is shown.

The in-cell touch panel 50 further includes a first substrate 521 and a second substrate 522. The first substrate 521 and the second substrate 522 are opposite to each other. The first substrate 521 has an inner surface Sd3, and the second substrate 522 has an outer surface Sd1 and an inner surface Sd2. The inner surface Sd2 of the second substrate 522 faces the inner surface Sd3 of the first substrate 521. The outer surface Sd1 faces away from the inner surface Sd3 of the first substrate 521.

The first substrate 521 can be a pixel array glass substrate. The first substrate 521 can include a number of pixel elements arranged in a matrix, each of which includes lines, electrodes, films, pads, isolative or conductive layers, vias, switches, or other semiconductor devices formed on glass. The first substrate 521 can have power rails such as the power rails 181 and 182 shown in FIGS. 4A to 4F, which are connected to an external circuit board such as a printed circuit board for receiving power source such as power signals Vdd and Vss or a ground signal not shown in the drawings.

The second substrate 522 can be a color filter glass substrate or a transparent glass substrate. The in-cell touch panel 50 has sensing electrode array 542 which are disposed on an inner surface Sd2 of the second substrate 522 near the first substrate 521, and a touch controller 544 which is disposed on the first substrate 521, or on a flexible printed circuit board not shown in figures.

The sensing electrode array 542 generates a sensing signal in response to the touch. The sensing electrode array 542 can be formed by shaping or etching a transparent conductor such as indium tin oxide (ITO) layer coated on an insulator such as glass or the second substrate 522.

The touch controller 544 can be an integrated circuit (IC). The touch controller 544 is operationally connected with the sensing electrode array 542. The touch controller 544 receives the sensing signal from the sensing electrode array 542 and identifies the touch. In this example, it is exemplified that the touch controller 544 is disposed on the first substrate 521, but this invention is not limited thereto. Where the touch controller 544 locates makes no difference if a discharge path is provided between the touch controller 544 and the sensing electrode array 542 and can protect them from electrostatic discharge damage.

The ESD protection circuit 546 includes ESD protection units 5462, connection pads 5464 and 5466, and a conductive layer 5468. The ESD protection units 5462 are disposed on the inner surface Sd3 of the first substrate 521. Each connection pad 5464 is disposed on the inner surface Sd3 of the first substrate 521 and connected to a corresponding ESD protection unit 5462. Each second connection pads 5466 is disposed on the inner surface Sd2 of the second substrate 522 and connected to a corresponding row (not illustrated) or column (not illustrated) of the sensing electrode array 542. The conductive layer 5468 is disposed between the first substrate 521 and the second substrate 522 and connected to the second connection pads 5464 and 5466.

The conductive layer 5468 can include a number of conductive balls 5468A. The conductive balls 5468A can be distributed between the first substrate 521 and the second substrate 522. The conductive balls 5468A can be made of metals such as Au or Ni as a whole, or made of a flexible or sustainable rubber or polymer particle covered or coated with conductive powder. The conductive balls 5468A can be evenly sprayed over the first substrate 521 after the first substrate 521 is being manufactured and before the second substrate 522 is disposed on the first substrate 521. The conductive balls 5468A can have a size similar to or larger than that of a photo spacer by which the two substrates 521 and 522 are separated. This assures that the conductive balls 5468A can be firmly and stably sandwiched between the two substrates 521 and 522. In this way, the conductive layer 5468 not only serves as a discharge path for discharging but also a holder for supporting the second substrate 522.

As such, the ESD protection units 5462, the connection pads 5464 and 5466, and the conductive layer 5468 can form a discharge path which is a low-ohmic path to discharge electrostatic charges accumulated on the sensing electrode array 542, or to prevent voltages or charges from building up to potentially damaging levels. In this way, when abnormally-high electrostatic charge is accumulated on the sensing electrode array 542, a corresponding ESD protection circuit 5462 can be activated to direct the discharged current into the ground route of the first substrate 521. Therefore, the sensing electrode array 542 or the touch controller 544 can be protected from electrostatic discharge damage, providing enhanced immunity to electrostatic discharge damage.

Figure 6:
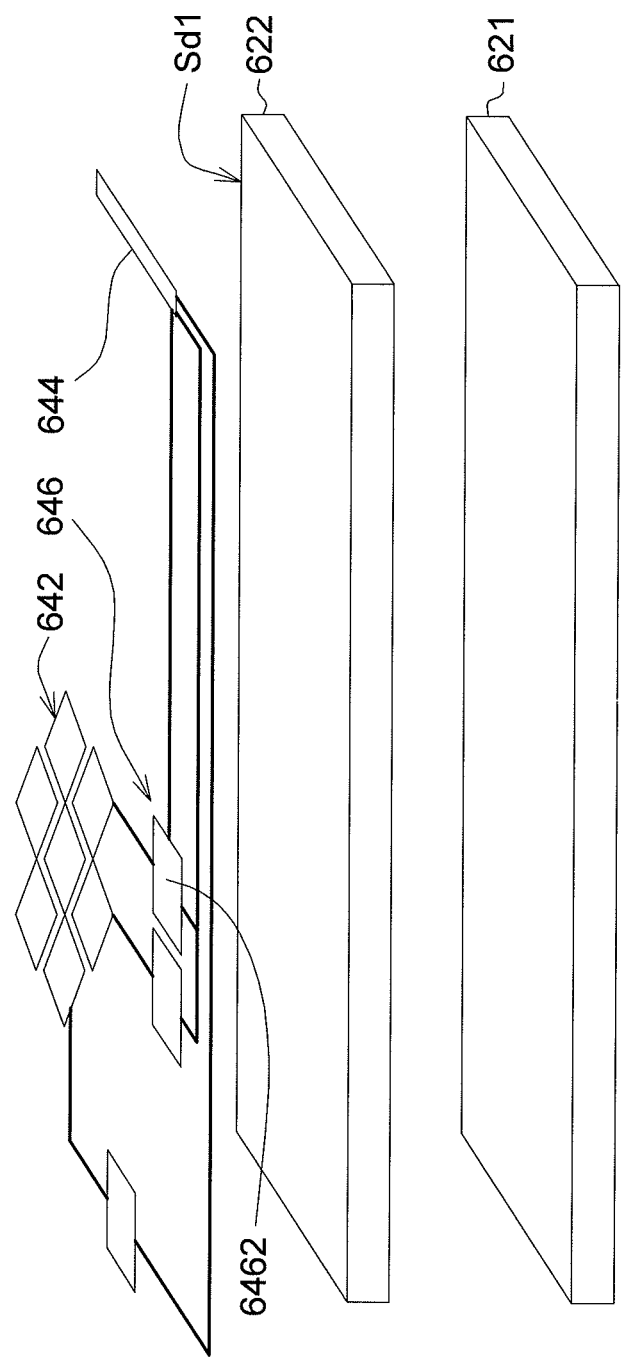
FIG. 6 is an exploded diagram showing an on-cell touch panel according to an embodiment of the invention.

FIG. 6 is an exploded diagram showing an on-cell touch panel according to an embodiment of the invention. In FIG. 6, an on-cell touch panel 60 is shown.

The on-cell touch panel 60 further includes a first substrate 621 and a second substrate 622 which are for example a pixel array glass substrate and a color filter glass substrate, respectively. The substrates 621 and 622 are similar to the substrates 521 and 522, and detailed description of them is not repeated for the sake of brevity.

The on-cell touch panel 60 comprises sensing electrode array 642 which are disposed on an outer surface Sd1 of the second substrate 622 away the first substrate 621, and a touch controller 644 which is disposed on the second substrate 622, or on a flexible printed circuit board not shown in figures.

The ESD protection circuit 646 includes ESD protection units 6462. The ESD protection units 6462 are disposed on the outer surface Sd1 of the second substrate 622. Each ESD protection unit 6462 is electrically connected to a corresponding row (not illustrated) or column (not illustrated) of the sensing electrode 642 and the touch controller 644 for electrostatic discharge protection.

In this way, when abnormally-high electrostatic charge is accumulated on the sensing electrode array 642, the corresponding ESD protection circuit 6462 can be activated to direct the discharged current into ground. Therefore, the sensing electrode array 642 and the touch controller 644 can be protected from electrostatic discharge damage, thus providing enhanced immunity to electrostatic discharge damage.

According to the exemplary embodiments of the touch panel and the electronic device, the ESD protection circuit is used to protect the sensing electrode array and the touch controller of the touch panel, so that the touch panel or the electronic device can have enhanced immunity to electrostatic discharge damage.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A touch panel, comprising:
   a sensing electrode array comprising a plurality of sensing electrodes arranged in a two dimensional array of n rows and m columns for generating a sensing signal in response to a touch on the touch panel, wherein n and m are positive integers;

a touch controller operationally connected to the sensing electrode array for receiving the sensing signal and identifying the touch on the touch panel;

an electrostatic discharge (ESD) protection circuit including a plurality of ESD protection units each being electrically connected to a corresponding row or column of the sensing electrode array and to the touch controller for electrostatic discharge protection;

a first substrate having an inner surface, wherein the first substrate is a pixel array substrate;

a second substrate opposite to the first substrate, wherein the second substrate is a color filter substrate, and the second substrate has an inner surface facing the inner surface of the first substrate and an outer surface facing away from the inner surface of the first substrate for receiving the touch; and a conductive layer disposed between the first substrate and the second substrate and electrically connected to the sensing electrodes and the ESD protection units;

wherein the ESD protection units are disposed on the inner surface of the first substrate, and the sensing electrodes are disposed on the inner surface of the second substrate.

2. The touch panel according to claim 1, wherein the ESD protection circuit has at least n+m ESD protection units.

3. The touch panel according to claim 1, wherein the sensing electrode array is disposed within an active area, and each ESD protection unit is disposed at a non-active area.

4. The touch panel according to claim 1, wherein each ESD protection unit comprises:

a first diode-connected transistor connected between a first power rail and a node for detecting a level of the sensing signal; and a second diode-connected transistor connected between a second power rail and the node.

5. The touch panel according to claim 1, wherein the touch panel is an in-cell touch panel.

6. The touch panel according to claim 1, wherein the touch panel is an on-cell touch panel.

7. The touch panel according to claim 1, further comprising:

a first connection pad disposed on the inner surface of the first substrate and connected to a corresponding ESD protection unit; and a second connection pad disposed on the inner surface of the second substrate and connected to a corresponding row or column of the sensing electrode array;

wherein the conductive layer electrically connected to the first connection pad and the second connection pad.

8. The touch panel according to claim 7, wherein the conductive layer includes a plurality of conductive balls.

9. The touch panel according to claim 8, wherein the conductive balls are distributed between the first substrate and the second substrate.

10. An electronic device, comprising:

the touch panel as in claim 1; and a processor operationally connected with the touch panel for controlling its operations.

* * * * *